United States Patent
Gowni et al.

(10) Patent No.: US 6,553,549 B1
(45) Date of Patent: Apr. 22, 2003

(54) STATIC TIMING ANALYSIS WITH SIMULATIONS ON CRITICAL PATH NETLISTS GENERATED BY STATIC TIMING ANALYSIS TOOLS

(75) Inventors: Shiva P. Gowni, Santa Clara, CA (US); Rakesh Mehrotra, Santa Clara, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/501,246

(22) Filed: Feb. 10, 2000

(51) Int. Cl.$^7$ ................................................ G06F 17/50
(52) U.S. Cl. ................................ 716/6; 716/4; 716/18; 703/14
(58) Field of Search ........................ 365/226; 703/14; 716/1–21; 235/6; 327/99; 379/208.01

(56) References Cited

U.S. PATENT DOCUMENTS

| | | | |
|---|---|---|---|
| 5,550,760 A | * | 8/1996 | Razdan et al. ............... 703/14 |
| 5,586,046 A | * | 12/1996 | Feldbaumer et al. ........... 716/18 |
| 6,075,932 A | * | 6/2000 | Khouja et al. ................. 716/4 |
| 6,223,141 B1 | * | 4/2001 | Ashar ........................... 703/14 |
| 6,236,613 B1 | * | 5/2001 | Ooshi ........................... 365/226 |

OTHER PUBLICATIONS

Greco et al., "Control of the switching transients of IGBTs series strings by high–performance drive units", 1999, IEEE, pp. 197–203 vol. 1.*

* cited by examiner

*Primary Examiner*—Vuthe Siek
*Assistant Examiner*—Helen B Rossoshek
(74) *Attorney, Agent, or Firm*—Christopher P. Maiorana, P.C.

(57) ABSTRACT

A circuit comprising a plurality of gates and a plurality of control circuits. The plurality of gates may each have an output connected to an input of a next gate of the plurality of gates. The plurality of control circuits may be connected to a second input of one or more gates of the plurality of gates. The plurality of control circuits may simulate switching.

20 Claims, 3 Drawing Sheets

STATIC TIMING ANALYSIS WITH SIMULATIONS ON CRITICAL PATH NETLISTS GENERATED BY STATIC TIMING ANALYSIS TOOLS

FIELD OF THE INVENTION

The present invention relates to an architecture and/or method for static timing analysis generally and, more particularly, to static timing analysis with simulations on critical path netlists generated by static timing analysis tools.

BACKGROUND OF THE INVENTION

Conventional simulation tools (e.g., Pathmill, a software tool available from Synopsys) are used for static timing analysis. However, such tools cannot analyze multiple input switching in the static mode. The resulting critical path netlist ties off (i) n-channel gates in NAND gates and (ii) p-channel gates in NOR gates to VDD and VSS, respectively. Conventional tools implement additional separate tools for such analysis. However, such additional tools have an extra cost and provide less than desirable accuracy and have capacity constraints, especially as the number of stages increases.

Since conventional static timing analysis tools cannot analyze multiple input switching in static mode, analysis results of such tools are not accurate. FIG. 1 illustrates a netlist with capacity to handle larger circuits, where circuit simulators such as HSPICE (e.g., a simulator available from Avant!) will either not run or take much longer and require more expensive and complex hardware. FIG. 2 illustrates a critical path netlist implemented to run more accurate hspice simulations. However, the critical path netlist of FIG. 2 still has only one input switching case. The other inputs of the NANDs (or NORs) gates are tied to VCC and VSS, appropriately. Analysis errors increase for larger numbers of sequential stages of logic gates. Deviation of the analysis results increase as the number of sequential stages increase.

SUMMARY OF THE INVENTION

The present invention concerns a circuit comprising a plurality of gates and a plurality of control circuits. The plurality of gates may each have an output connected to an input of a next gate of the plurality of gates. The plurality of control circuits may be connected to a second input of one or more gates of the plurality of gates. The plurality of control circuits may simulate switching.

The objects, features and advantages of the present invention include providing a method and/or architecture for static timing analysis that may (i) analyze multiple input switching cases in static mode, (ii) provide an accurate netlist analysis, (iii) provide a critical path netlist analysis and/or (iv) handle larger circuits.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 3:
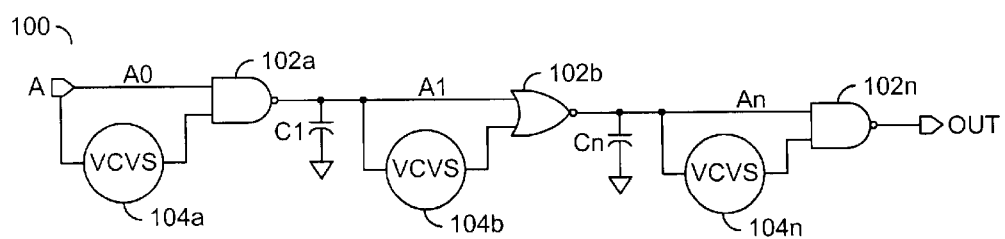
FIG. 3 is a schematic diagram of a preferred embodiment of the present invention.

Referring to FIG. 3, a block diagram of a schematic (or circuit) 100 of a netlist is shown in accordance with a preferred embodiment of the present invention. The schematic 100 may be implemented, in one example, as a netlist. The schematic 100 generally comprises a number of gates 102a–102n, where n is an integer, and a number of voltage controlled voltage sources (VCVS) 104a–104n. The gates 102a–102n may each be implemented as a NAND gate, a NOR gate or other appropriate gate (e.g., And-Or-Invert (AOI), Or-And-Invert (OAI), etc.) to meet the design criteria of a particular implementation. The gate 102a may have a first input that may receive a signal (e.g., A) and a second input that may be coupled to the input A through the voltage controlled voltage source 104a. A number of capacitors C1–Cn may be implemented between one of the inputs of each of the gates 102b–102n and ground. The capacitors C1–Cn may be parasitic capacitors. The gate 102a may be implemented, in one example, without a capacitor.

The gate 102b may have a first input that may receive a signal from the gate 102a and a second input that may be coupled to the gate 102a through the voltage controlled voltage source 104b. Similarly, the gate 102n may have a first input that may be connected to the gate 102b and a second input that may be connected, through the voltage controlled voltage source 104n, to the gate 102b. The first and second inputs of the gates 102b–102n may each be implemented, in one example, as active nodes. The gate 102n may present a signal (e.g., OUT).

Figure 1:
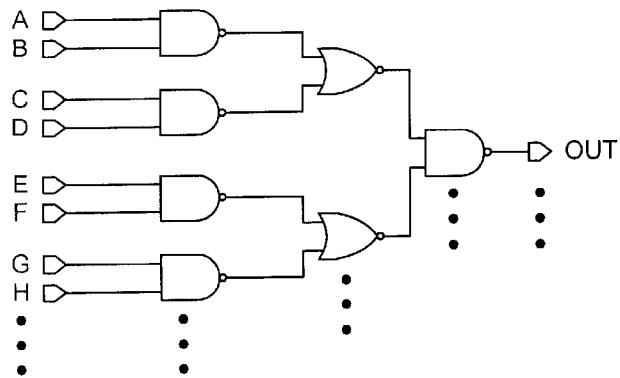
FIG. 1 is a schematic diagram of a conventional netlist for timing analysis.
Figure 2:
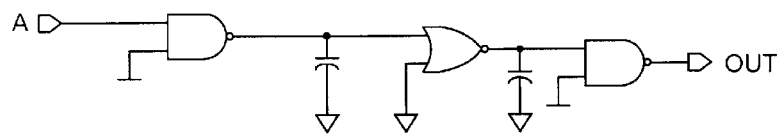
FIG. 2 is a schematic diagram of a conventional netlist for timing analysis.

A number of nodes (e.g., A1–An) may be coupled to each output of the gates 102a–102n. The capacitors C1–Cn may be coupled to the nodes A1–An. The capacitors C1–Cn may, in one example, allow the nodes A1–An to be implemented as active nodes. The active nodes A1–An may be connected to an output of the gates 102a–102(n–1), respectively. For example, the active node A1 may be connected to (i) the output of the gate 102a, (ii) a first side of the capacitor C1, (iii) the first input at the gate 102b and (iv) a first side of the VCVS 104b. The active nodes A1–An may be implemented.to create a critical path of the schematic 100. A tied off node may be connected to VCC or VSS, as shown in FIG. 2.

The voltage controlled voltage sources 104a–104n may be inserted either (i) between (a) the output of the gates 102a–102(n–1) and (b) the second input of the gate 102b–102n or (ii) between (a) the first and (b) the second input of a tied off node. However, either the first or the second input may be the tied off input. Additionally, the gates 102b–102n may be implemented as multi-input gates. The VCVS 104a–104n may set a voltage of the second input of the gates 102a–102n. The gates 102a–102n may be implemented as a number of stages. For example, the gate 102a may be implemented as a first stage, while the gate 104b may be implemented as a second stage. The schematic 100 may implemented N number of stages, where N is an integer. As the number of stages increases the tolerance of the schematic 100 remains accurate. The improved tolerance may provide an accurate netlist analysis.

Additionally, the schematic 100 may be implemented, in one example, with a PLD analysis tool. The PLD implementation of the schematic 100 may be implemented as 2–15 stages (or more stages).

The voltage controlled voltage sources 104a–104n may emulate a multiple input switching effect that may be implemented to achieve accurate simulation results. The schematic 100 may implement the voltage controlled voltage sources 104a–104n, to emulate a multiple input switching effect. In one example, the switching may comprise simultaneous switching.

The schematic 100 may provide accurate simulation results. The accurate simulation results may be implemented by running Hspice on a smaller netlist. The schematic 100 may additionally maintain benefits of running tools such as Pathmill on larger netlists. Conventional netlists implement separate tools that go in and run dynamic simulation on selected circuits. The separate tools (i) require additional run time and more hardware it and (ii) are not as accurate as Hspice. As the number of stages increases, the additional tools (or tools options) act like simulators. The simulators do not act as static timing analysis tools and loose their respective advantages.

Figure 4:
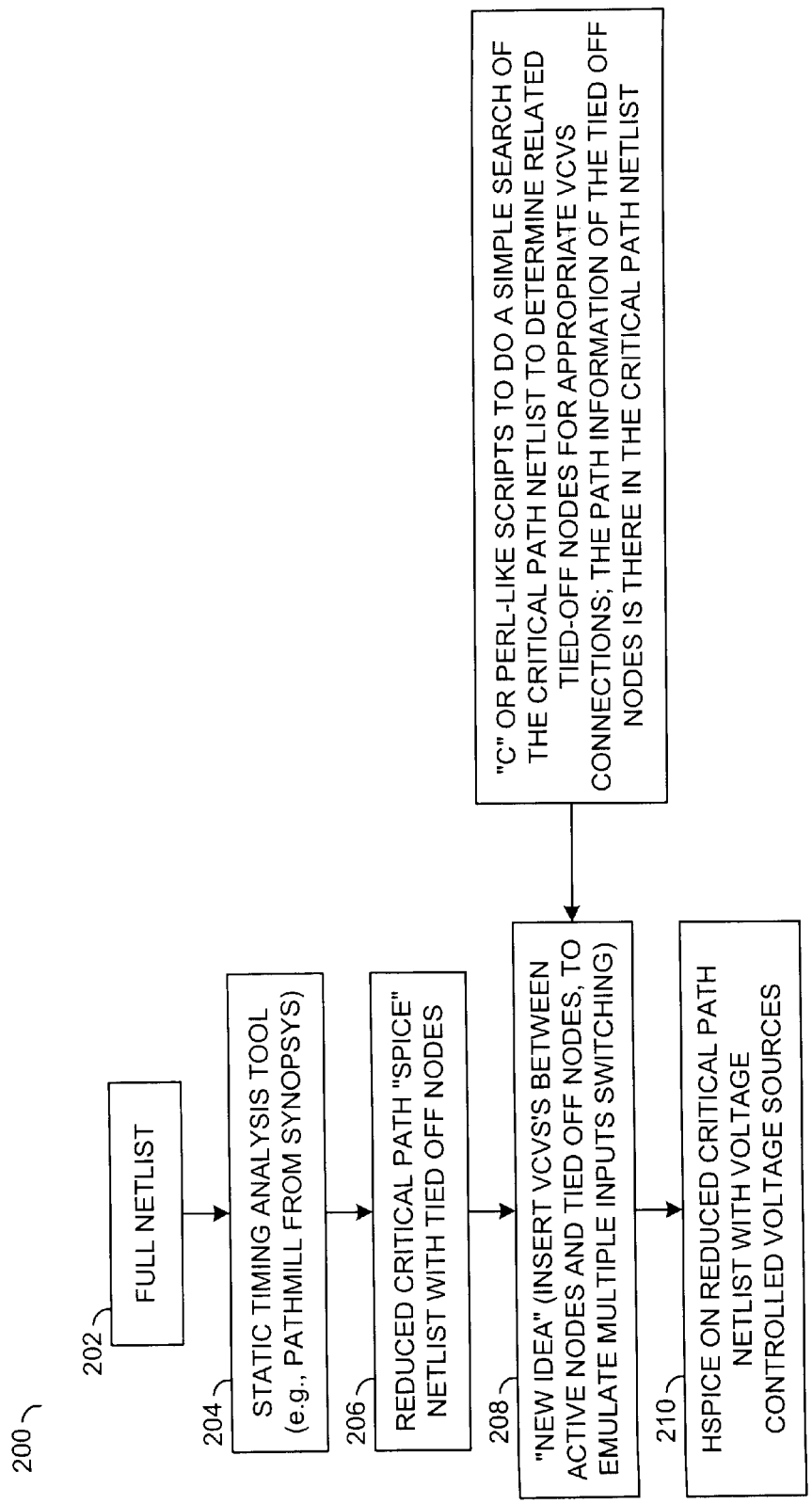
FIG. 4 is a flow chart illustrating the operation of the present invention.

Referring to FIG. 4, a netflow 200 is shown in accordance with the present invention. The netflow 200 generally comprises a full netlist block 202, a static timing analysis tool block 204, a reduced critical path netlist 206, a block 208, and a reduced critical path netlist 210. The block 208 may be implemented in a programming language (e.g., C) or using perl-like scripts to implement multiple searches of the critical path netlists to determine related tie-off nodes for appropriate VCVS connections. The path information of the tied-off nodes may be in the critical path netlist.

Figure 5:
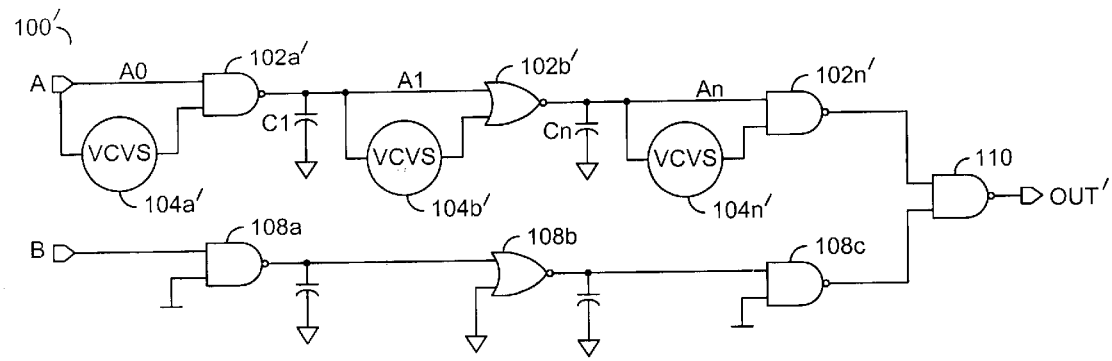
FIG. 5 is a schematic diagram of an alternate embodiment of the present invention.

Referring to FIG. 5, a detailed circuit schematic 100' of an alternate netlist is shown. The schematic 100' may have similar components as the schematic 100, marked with prime notation. The schematic 100' may implement a hybrid of conventional netlist architecture components with the architecture of the present invention. The schematic 100' may additionally implement a number of gates 108a–108n and a gate 110. The gates 108a–108n may be implemented in a configuration similar to the gates 102a–102n. However, the gate 108a may receive a signal (e.g., B). The gate 110 may receive the output of the gate 102n and an output of the gate 108n. The gate 110 may present a signal (e.g., OUT') in response to the gate 102n and the gate 108n.

Figure 6:
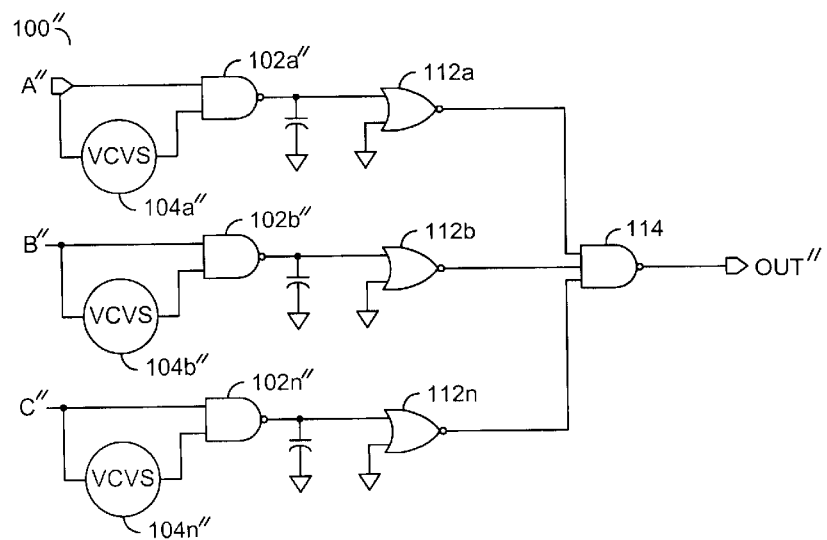
FIG. 6 is a schematic diagram of an alternate embodiment of the present invention.

Referring to FIG. 6 a detailed circuit schematic 100" of a netlist is shown. The schematic 100" may have similar components as the schematic 100, marked with double prime notation. The schematic 100" may implement conventional netlist architecture with the architecture of the present invention. The schematic 100" may additionally implement a number of gates 112a–112n and a gate 114. The gates 112a–112n may each receive the output of the gate 102a"–102n". The gate 114 may receive each output of the gates 112a–112n. The gate 102a" may receive a signal (e.g., A"). The gate 102b" may receive a signal (e.g., B"). The gate 102c" may receive a signal (e.g., C"). The gate 114 may present a signal (e.g., OUT") in response to the gates 112a–112n.

The present invention may additionally be implemented to provide simulations at the transistor level for different process, voltage and temperature conditions at a gate or a transistor level. The present invention may provide simulations either manually or automatically (e.g., through software).

The function performed by the flow chart of FIG. 4 may be implemented using a conventional general purpose digital computer programmed according to the teachings of the present specification, as will be apparent to those skilled in the relevant art(s) Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMS, RAMS, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a plurality of gates having an output connected to an input of a next gate of said plurality of gates; and
   a plurality of control circuits connected to a second input of one or more gates of said plurality of gates, wherein said plurality of control circuits simulate switching of two or more of said inputs.

2. The apparatus according to claim 1, wherein said output of said plurality of gates is configured to control said plurality of control circuits.

3. The apparatus according to claim 2, wherein each output is configured to have a voltage.

4. The apparatus according to claim 3, wherein said plurality of control circuits each comprise a voltage controlled voltage source.

5. The apparatus according to claim 4, wherein each of said voltages is configured to control said voltage, controlled voltage source.

6. The apparatus according to claim 5, wherein each of said voltage controlled voltage sources is configured to control said one or more gates.

7. The apparatus according to claim 2, wherein one or more of said plurality of gates comprises two or more inputs.

8. The apparatus according to claim 7, wherein each of said outputs comprises an active node.

9. The apparatus according to claim 1, further comprising: one or more conventional control circuits.

10. The apparatus according to claim 1, wherein said switching by said control circuits comprises substantially simultaneous switching of said two or more of said inputs.

11. An apparatus comprising:
    means for controlling a plurality of gates having an output connected to an input of a next gate of said plurality of gates; and
    means for controlling a plurality of control circuits connected to a second input of one or more gates of said plurality of gates, wherein (i) said control circuits simulate switching and (ii) said plurality of gates simulate switching of two or more of said inputs.

12. The apparatus according to claim 11, wherein said switching comprises simultaneous switching.

13. A method for generating a netlist simulation comprising the steps of:
   (A) simulating the switching of a plurality of gates having an output connected to an input of a next gate of said plurality of gates; and
   (B) controlling the switching of two or more gates of said plurality of gates by simulating switching of two or more of said inputs of said gates.

14. The method according to claim 13, wherein step (B) simulates substantially simultaneous switching of said two or more of said inputs of said gates.

15. The method according to claim 13, wherein said output of said plurality of gates is configured to control step (A).

16. The method according to claim 13, wherein each output is configured to have a voltage.

17. The method according to claim 16, wherein steps (A) and (B) are further configured to control said one or more gates in response to each of said voltages.

18. The method according to claim 16, further comprising the following step:
   (C) controlling each of said voltages.

19. A computer readable medium containing instructions for generating a netlist simulation comprising:
   steps (A) and (B) according to claim 13.

20. A computer readable medium containing instructions for generating a netlist simulation comprising:
   (A) simulating the switching a plurality of gates having an output connected to an input of a next gate of said plurality of gates; and
   (B) controlling the switching one or more gates of said plurality of gates by simulating switching of two or more of said inputs of said gates.

* * * * *